(12) United States Patent
Nikonov et al.

(10) Patent No.: US 7,196,367 B2
(45) Date of Patent: Mar. 27, 2007

(54) SPIN POLARIZATION AMPLIFYING TRANSISTOR

(75) Inventors: Dmitri E. Nikonov, Morgan Hill, CA (US); George I. Bourianoff, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 10/956,867

(22) Filed: Sep. 30, 2004

(65) Prior Publication Data
US 2006/0071248 A1  Apr. 6, 2006

(51) Int. Cl.
H01L 29/76 (2006.01)
H01L 29/94 (2006.01)
H01L 31/113 (2006.01)
H01L 31/119 (2006.01)

(52) U.S. Cl. ............... 257/295; 257/421; 257/E29.164; 257/E21.575; 257/E27.054; 257/565

(58) Field of Classification Search .............. 257/295, 257/197, 421–427, E29.164, E21.575, 565, 257/E27.054
See application file for complete search history.

(56) References Cited

U.S. PATENT DOCUMENTS 5,973,334 A * 10/1999 Mizushima et al. .......... 257/25

OTHER PUBLICATIONS

Flatté, M. E., et al., "Theory of semiconductor magnetic bipolar transistors," Applied Physics Letters, vol. 82, No. 26, Jun. 30, 2003, pp. 4740-4742.

Johnson, M., "The all-metal spin transistor," Advanced Technology/ Solid State, IEEE Spectrum May 1994, pp. 47-51.

Wolf, S. A., et al., "Spintronics : A Spin-Based Electronics Vision for the Future," Nov. 16, 2001, vol. 294, Science, www.sciencemag.org, pp. 1488-1495.

Sugahara, S., et al., "A spin metal-oxide-semiconductor field-effect transistor using half-mettalic-ferromagnet contacts for the source and drain," Applied Physics Letters, vol. 84, No. 13, Mar. 29, 2004, pp. 2307-2309.

Ohno, H., et al., "Electric-field control of ferromagnetism," Nature, vol. 408, Dec. 21/28, 2000, www.nature.com, pp. 944-946.

MacDonald, A., "Semiconductor Spintronics," UT Austin, 2003, pp. 51.

Zorpette, G., et al., "The Quest for the SP," IEEE Spectrum, Dec. 2001, pp. 30-35.

Anonymous, "Introduction to Spintronics and Spin Quantum Computation," May 12, 2004, pp. 2, www.physics.umd.edu/rgroups/spin/intro.html.

Argonne National Laboratory, "Nanomagnetic Research Points the Way to New-Generation Computers," Extraordinary Tools, Extraordinary Science and Technology, Aug. 2001, pp. 2.

Mani, R.G., et al., "Nuclear spin based memory and logic in quantum Hall semiconductor nanostructures for quantum computing applications," Physica E 12 (2002) 152-156.

(Continued)

Primary Examiner—Monica Lewis
(74) Attorney, Agent, or Firm—Blakely, Sokoloff, Taylor & Zafman LLP

(57) ABSTRACT

An embodiment of the invention is a transistor formed in part by a ferromagnetic semiconductor with a sufficiently high ferromagnetic transition temperature to coherently amplify spin polarization of a current. For example, an injected non-polarized control current creates ferromagnetic conditions within the transistor base, enabling a small spin-polarized signal current to generate spontaneous magnetization of a larger output current.

8 Claims, 7 Drawing Sheets

OTHER PUBLICATIONS

Fabian, J., "Spin-polarized current amplification and spin injection in magnetic bipolar transistors," arXiv:cond-mat/0311456v1, Nov. 19, 2003, pp. 1-14.

Bourianoff, G., "Silicon nanoelectronics and nanotech innovation," Intel Corporation, Feb. 9, 2004, pp. 26.

Bandyopadhyay, S., "An IEEE NANO2003 Tutorial on Spintronics," Electrical Engineering, Jun. 29, 2003, pp. 7.

Nikonov, D., et al., Spin Transistors Based on Electronic Control of Ferromagnetism, Apr. 7, 2004, Talk at Texas A&M, pp. 16.

Nikonov, D., et al., "Overview of Spintronics and Its place in the Semiconductor Industry Roadmap," Apr. 6, 2004, Talk at Texas A&M, pp. 19.

Cahay, M., et al., "Fundamental of Spintronics And Quantum Information Processing," IEEE, pp. 45.

Wolf, S., et al. "Spintronics: A New Paradigm for Electronics for the New Millennium," IEEE Transactions on Magnetic, vol. 36, No. 5, Sep. 5, 2000, pp. 2748-2751.

König, J., et all, "Ferromagnetism in (III,Mn) V Semiconductors," Nov. 16, 2001, arXiv:cond-mat/0111314 v1, pp. 51.

Veeco, "Advances in MBE-Grown Spintronic Materials: GaMnAs and ZnCdSe," Application Note, Aug. 2003, Note No. 2/03, pp. 3.

Park, Y.D., et al., "A Group-IV Ferromagnetic Semiconductor: $Mn_xGe_{1-x}$," Science, vol. 295, Jan. 25, 2002, pp. 651-654, www.sciencemag.org.

Ritala, M., et al., "Atomic layer epitaxy-a valuable tool for nanotechnology?" Nanotechnology 10 (1999), pp. 19-24.

Johnston, E., et al., Phys. Rev B, 68 165328 (2003).

Bandyopadhyay, S., et al., "Supercomputing with spin-polarized single electrons in a quantum coupled architecture," Nanotechnology 5, Apr. 26, 1994 pp. 113-133.

Bandyopadhyay, S, et al., "Granular nanoelectronics," The logical gateway to the 21st century, IEEE Potentials, Apr./May 1996, pp. 8-11.

* cited by examiner

SPIN POLARIZATION AMPLIFYING TRANSISTOR

FIELD

Embodiments of the invention relate to spin-based electronics, and more specifically to a semiconductor transistor that coherently amplifies the spin polarization of a current.

BACKGROUND

Electronics manufacturers are currently researching and developing future generations of electronic devices. One such development includes technology designed to surpass current CMOS (complementary metal oxide semiconductor) transistor technology as CMOS feature size approaches fundamental physical limits. Electronics, in particular CMOS devices, are based on the movement of electric charge. A next generation of electronic devices will focus on the interaction between electron spin and electron charge and on the interaction between multiple electron spins.

The physics behind spin electronics, or "spintronics," dates to the early $20^{th}$ century when experiments directed to the fine structure of hydrogen and alkali metals exhibited features inconsistent with prevailing scientific models. To explain the results, scientists proposed that an electron has an intrinsic angular momentum and magnetic dipole moment. The z components thereof are specified by a fourth quantum number $m_s$ that can assume a value of $+\frac{1}{2}$ or $-\frac{1}{2}$. The electron has an "up" spin or a "down" sp for a positive and negative quantum number $m_s$ respectively.

Devices that exploit spin properties, in lieu of or addition to charge degrees of freedom, offer potential benefits over devices operating on charge motion alone. One potential benefit of spintronics is reduced power consumption versus conventional electronics as the amount of energy required to change the orientation of an electron spin is much less than to move charge. This determines the ratio of the spin relaxation rate and switching rate and can amount to orders of magnitude. Another potential benefit is the ability to manufacture devices, for example memory cells and logic gates, that operate on a single atomic scale. The possibility of devices that combine reduced power consumption and atomic scale may fuel Moore's Law progress far beyond what is possible with, for example, CMOS technology.

The most significant commercial application of spintronics thus far is a ferromagnetic storage device (e.g., hard drive in a personal computer) and corresponding read-head. Based on the effect of giant-magnetoresistance ("GMR"), the storage device incorporates alternating layers of ferromagnetic and insulating material configured in such a manner that the resistance of the material is either small to large (and can indicate thereby a binary "0" or "1") depending on the relative magnetic orientation in the ferromagnetic layers.

Spintronic applications, however, need not be limited to storage devices. In particular, semiconductor-based spin devices offer the potential to, through spin transport mechanisms like spin polarizers and spin valves, amplify signals. Amplifying spin devices may form the basis of logic gates and more sophisticated building blocks that eventually may lead to entire spin-based electronic systems.

Viewed as a whole, the spintronics paradigm offers a variety of potential improvements over, for example, CMOS. Those improvements include nonvolatility, high switching speed, high density, energy efficiency, and the ability to be customized and reconfigured.

DETAILED DESCRIPTION

Figure 1:
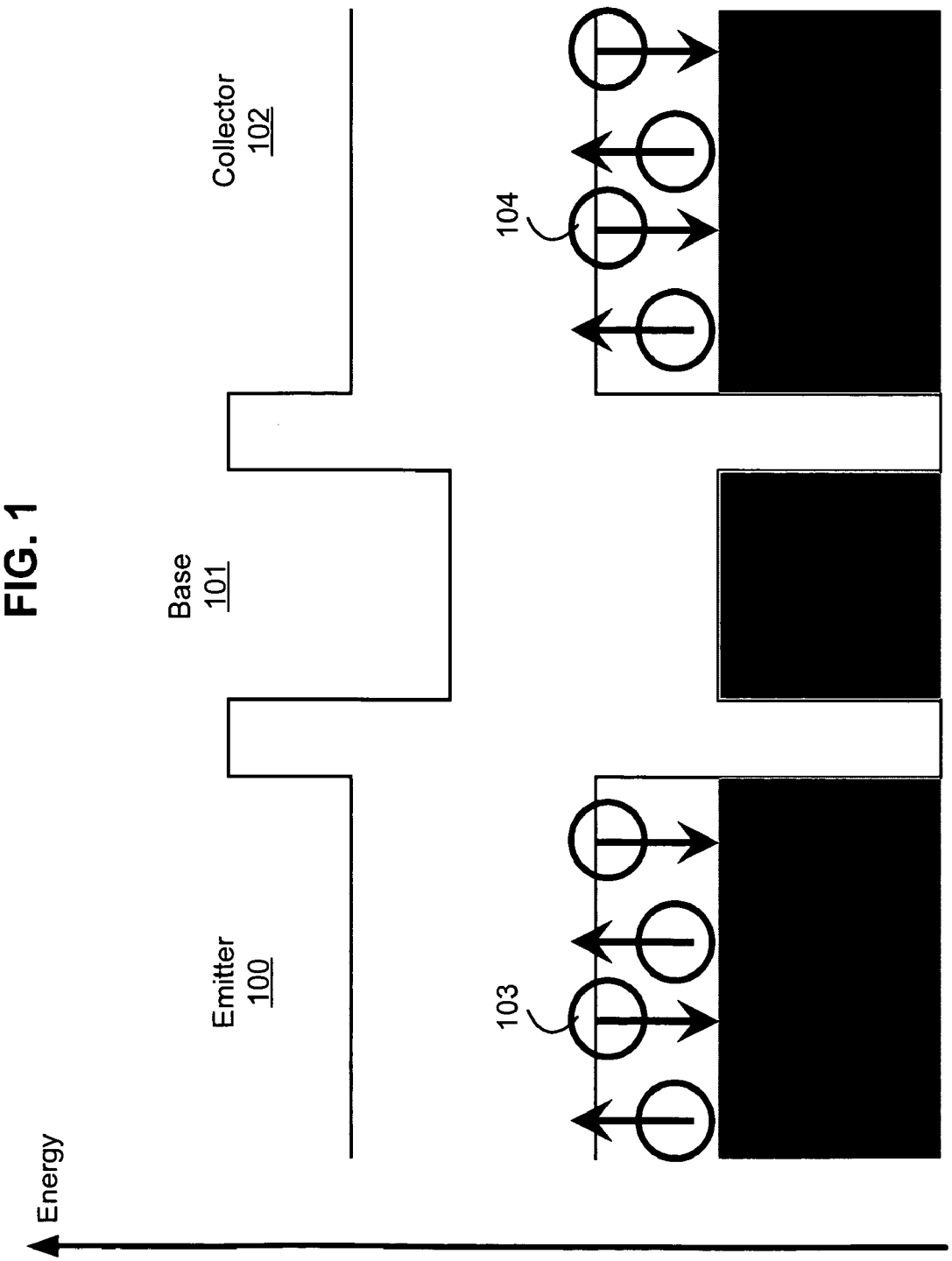
FIG. 1: illustration of the band structure of a transistor of an embodiment in an initial non-magnetized state

Embodiments of a coherent semiconducting, spin polarization amplifying transistor are described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment of the invention is a transistor formed in part by a ferromagnetic semiconductor with a sufficiently high ferromagnetic transition temperature to coherently amplify spin polarization of a current. For example, an injected non-polarized control current creates ferromagnetic conditions within the transistor, enabling a small spin-polarized signal current to generate spontaneous magnetization of a larger output current. The transistor of an embodiment acts as an amplifier as the magnitude of the output current is greater than the magnitude of the signal current. The amplification of a transistor of an embodiment is further coherent in that the small, spin-polarized signal current substantially imprints its spin polarization orientation on the larger output current. The transistor of an embodiment furthermore requires neither an external magnetic field nor permanently magnetized components to operate.

To date, spintronic devices capable of coherent amplification have eluded scientists and engineers. Recent developments to the understanding of electron spins in semiconductors (including, e.g., a heightened understanding of high-temperature magnetic semiconductors, long-lived spin states, and injection of spins through semiconductor interfaces) have encouraged various proposals for functional spintronic devices. However, all the devices proposed previously as "spin transistors" seek to modulate the transistor source-drain current by filtering out a certain spin polarization rather than increasing spin polarization.

The transistor of an embodiment fundamentally differs from traditionally proposed spintronic devices in that it increases the polarization percentage of the source-drain current (i.e., the percentage of polarization orientation of the signal current maintained by the amplified source-drain output current) by first invoking a spontaneous ferromagnetic phase transition within the transistor with a control current. An important aspect of the device of an embodiment is introducing the signal current after creating the required conditions for spontaneous ferromagnetic transition with the control current.

Coherent amplification (i.e., the output current has substantially the same spin polarization as the spin polarized signal current as introduced above) is important for spintronic devices operating in a noisy environment and for cascading such devices as may be required to construct complex combinations of spintronic devices to, for example, process information. Spintronic logic or memory circuits hold a promise of, among other benefits, scaling in size smaller than CMOS physical limitations, dissipating less power than CMOS circuits, and efficiently integrating optical and electrical information processing technology.

As introduced, the transistor of an embodiment relies on principles of ferromagnetism to operate. In general, ferromagnetic materials exhibit a permanent magnetic dipole movement in the absence of an external magnetic field. The permanent magnetic dipole moment is derived from uncanceled electron spins resulting from the electron structure of the ferromagnetic material. The orientation of the permanent magnetic dipoles of the bulk ferromagnetic material can be altered by applying an external magnetic field. The permanent magnetic dipoles will align with the external magnetic field and remain aligned when the external magnetic field is removed.

Ferromagnetic properties are generally associated with, for example, iron, cobalt, nickel, and manganese oxide compounds. However, certain semiconductor alloys also exhibit ferromagnetic properties. Semiconductors doped with magnetic impurities become ferromagnetic below their ferromagnetic transition temperature (above which thermal atomic motions counteract the coupling forces between adjacent atomic magnetic dipoles, causing misalignment among the dipoles to the extent that the material ceases to be ferromagnetic) and above a certain density of the free carriers (i.e. the density that mediates strong enough coupling between localized atomic magnetic dipoles to align the dipoles). If the ferromagnetic conditions are created and the carrier spins are initially unpolarized, application of an external magnetic field may cause the carrier spins to spontaneously align in the direction determined by the orientation of the field.

In general, ferromagnetic semiconductors are either II-VI or III-V semiconductor alloys, and there are a variety of ferromagnetic semiconductor alloys from which to choose. However, the commercial practicability of a given ferromagnetic semiconductor depends on, among other properties, the ferromagnetic transition temperature of the semiconductor. A higher ferromagnetic transition temperature may allow a ferromagnetic device to operate at practicable temperatures common to semiconductor devices whereas a lower ferromagnetic transition temperature may require special device cooling or otherwise not be feasible.

It is well know that the conductivity of a semiconductor can be altered greatly by the doping the semiconductor to change the number of charge carriers. As noted, the ferromagnetism of a semiconductor can also be controlled by doping to alter its charge carrier concentration. A ferromagnetic semiconductor has both bound localized electrons and free electrons. The interactions between and among the electrons, bound and free, are based on both Coulomb interaction and spin interaction mechanisms. For a semiconductor to be ferromagnetic, it requires, among other properties, a sufficient number of free carriers. For example, in an embodiment the ferromagnetic semiconductor is $Mn_x Ga_{1-x}As$. The inclusion of the magnetic impurity manganese (electron configuration $[Ar]3d^5 4s^2$ versus $[Ar]3d^{10}4s^2 4p^1$ for gallium) in gallium lattice sites creates holes in the GaAs lattice, increasing the number of free charge carriers (i.e., holes).

The transistor of an embodiment is a semiconductor heterostructure consisting of a non-magnetic emitter, ferromagnetic undoped base, and a non-magnetic collector arranged similarly to a heterojunction transistor. In an embodiment, one or more of the emitter, base, or collector are p-doped. In a further embodiment, the emitter, base, and collector are p-doped. The band diagram of the transistor of an embodiment will be described with reference to FIGS. 1 through 4 representing a clock cycle as, for example, a signal current is spin-coherently amplified. One species of carriers is sufficient for operation, and the use of larger mass holes allows a higher ferromagnetic transition temperature.

FIG. 1 illustrates the band diagram of a transistor of an embodiment in an initial state. In the initial state, there is a low density of free carriers in the base 101. More particularly, there are insufficient carriers to make the base 101 ferromagnetic, and the carriers that are in the base (not illustrated) are not aligned or oriented. The band diagram illustrated by FIG. 1 further illustrates barriers present between the emitter 100, base 101, and collector 102. Carriers substantially maintain their spin polarization while traversing the barriers either by tunneling or by thermionic emission because these processes do not involve spin-selective mechanisms. Also illustrated are non-spin polarized carriers 103 and 104 for the emitter 100 and collector 102 respectively.

Figure 2:
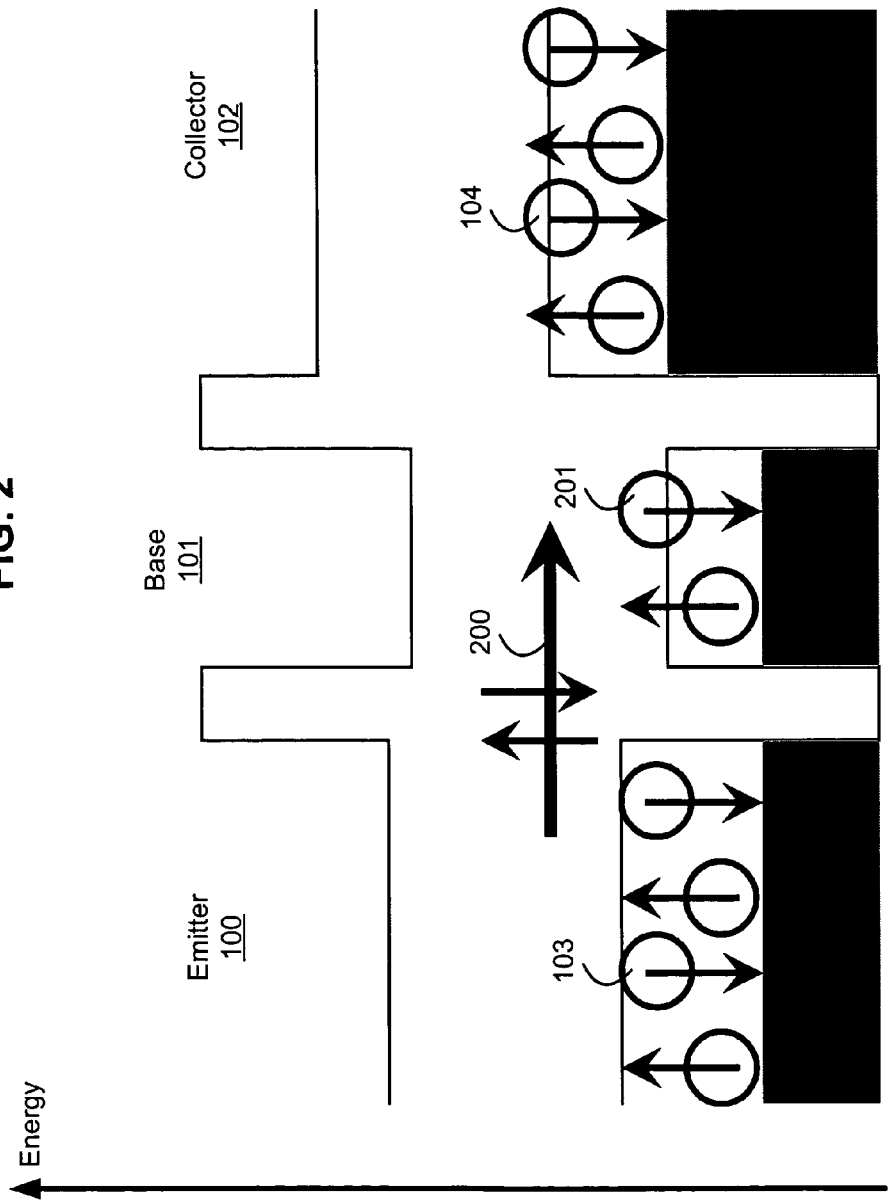
FIG. 2: illustration of the band structure of a transistor of an embodiment in a ferromagnetic state showing current injected from the collector the base

FIG. 2 illustrates a non-spin polarized control current 200 injected from the emitter 100 into the base 101. The control current 200 is generated by applying a voltage across the emitter 100 and the base 101. Once the control current 200 has been injected, there is a sufficient density of base carriers 201 (e.g., the carrier density is above a critical carrier density) to enable a ferromagnetic transition in the base 101. Said differently, the injected emitter-base control current 200 has created ferromagnetic conditions in the base 101. Further, the injected carriers from control current 200 contain carrier spins with arbitrary orientations, so that its average spin polarization is essentially zero.

Figure 3:
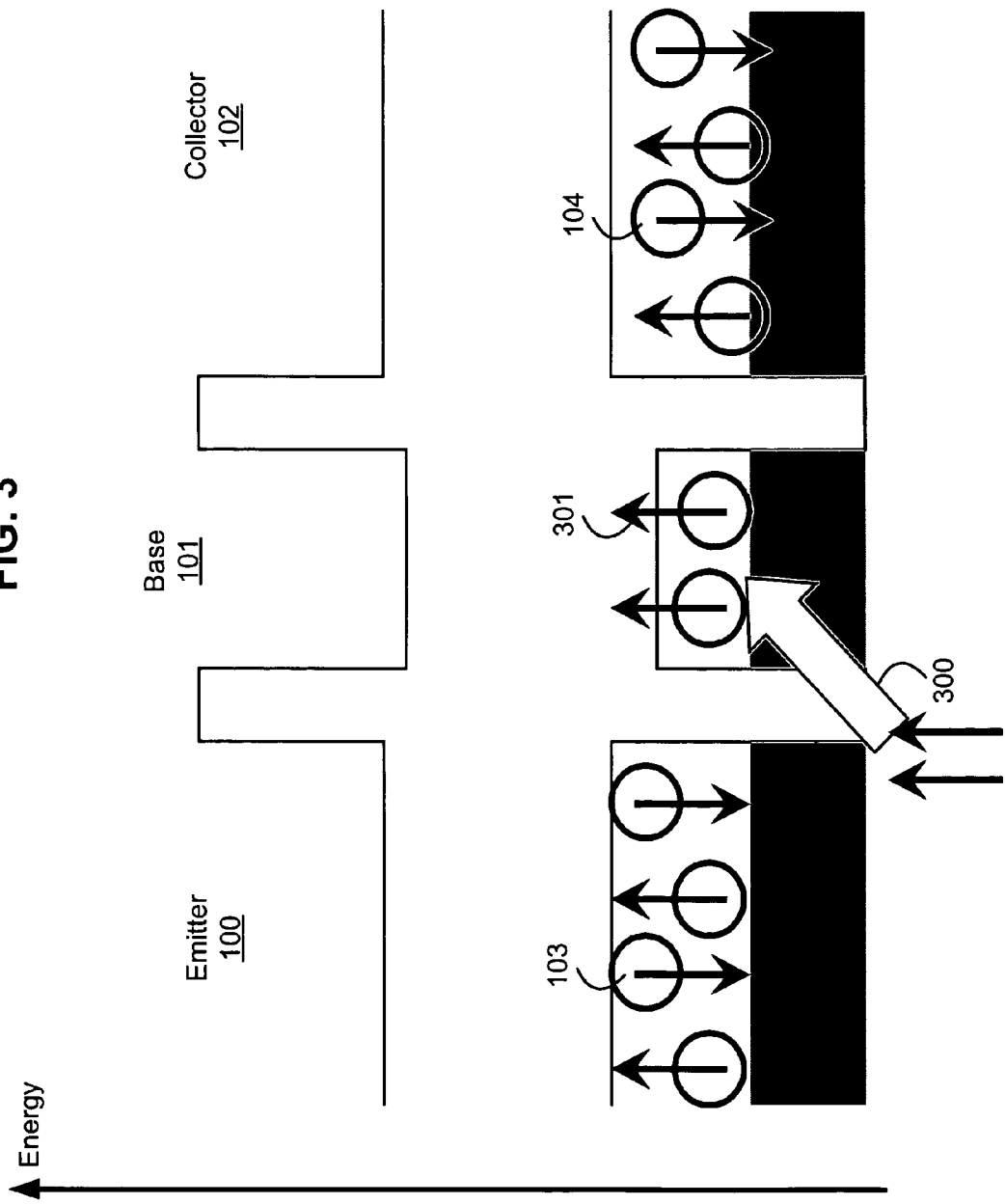
FIG. 3: illustration of the band structure of a transistor of an embodiment in a ferromagnetic state showing an injected spin-polarized base current

FIG. 3 illustrates biasing the base 101 to inject a signal current 300 into the base 101. The carriers of the signal current 300 are at least partially spin polarized. The injection of the at least partially spin polarized signal current 300 in the base 101 causes substantially all the carrier 301 spins in the base 101 to align with the signal current 300 carrier polarization orientation as the substantially fully aligned state is a lower energy state. It is to be understood that the minimum signal current 300 that can be coherently amplified is limited by thermal fluctuations of the spin polarization, the carrier density in the base 101, and the geometry of the device.

Figure 4:
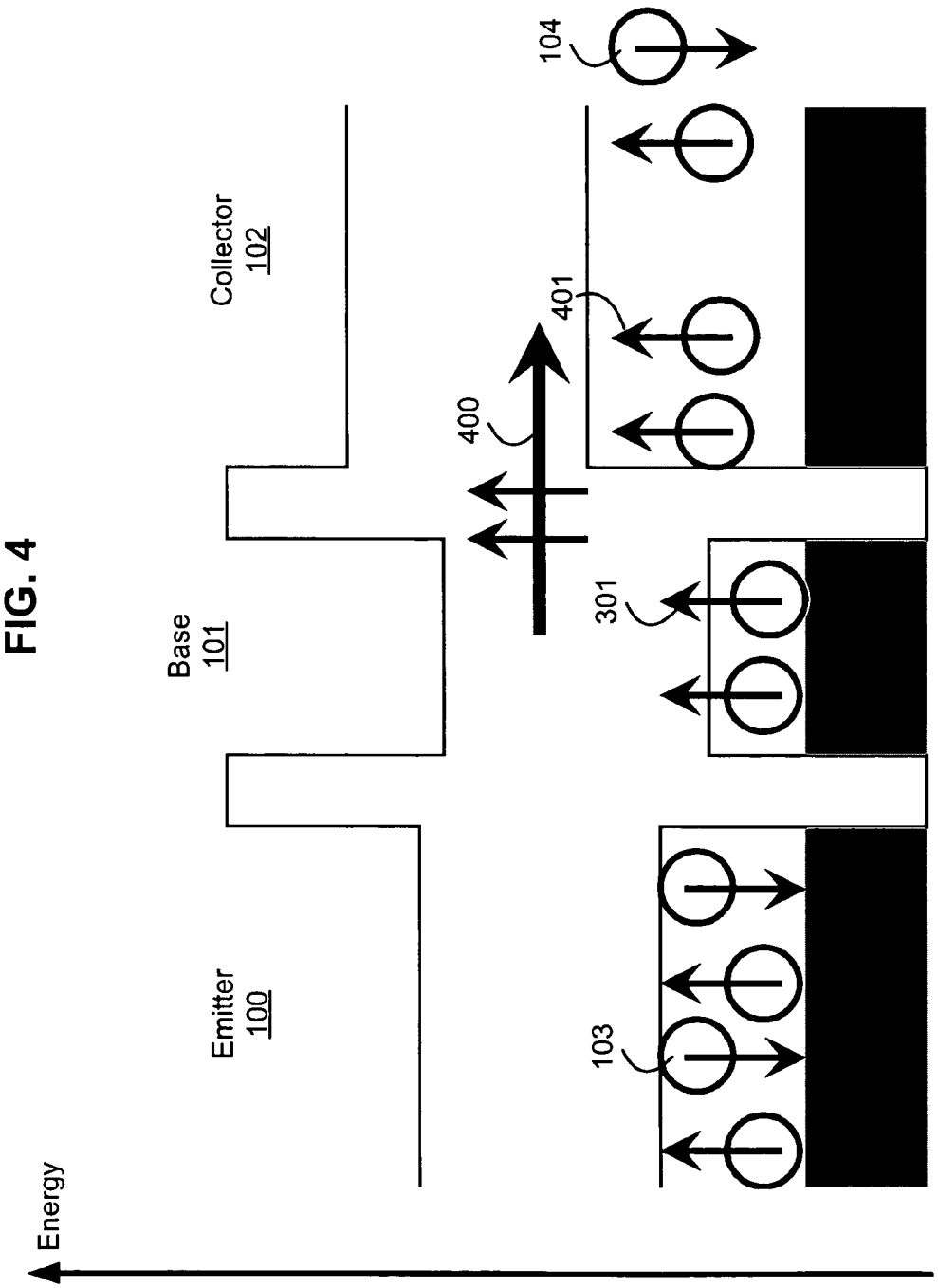
FIG. 4: illustration of the band structure of a transistor of an embodiment in a ferroelectric showing an spin-polarized output current

FIG. 4 illustrates an output current 400 generated by applying a voltage across the emitter 100 and collector 102 to extract the current out of the base 101. The effluent output current 400 created thereby is coherent in that it is substantially completely spin polarized in the orientation determined by the influent signal current 300. Carriers 401 in the collector 102 become spin polarized due to the contribution of the extracted spin-polarized current 400 from the base 101. The output current 400 is further larger than the signal current 300. In an embodiment, the gain may be more than 1000 (i.e. ratio of output current 400 to signal current 300). Accordingly, an embodiment amplifies a signal current 300 while maintaining the spin polarization of the signal current 300. Said alternatively, an embodiment realizes a real spin gain of an at least partially spin polarized signal current 300. The spin amplification in turn, and among other functions, supports fan-outs similar to conventional logic circuits and substantially necessary to fabricate complex logic circuits. Further, due to fast carrier spin relaxation, the spontaneous ferromagnetic transition in the base occurs very rapidly (e.g., a picosecond spin relaxation time scale is typical for holes in semiconductors) allowing high-speed device operation.

The above outlined sequence of operations is only one of the possible embodiments illustrative of the functional principles of the transistor. In another embodiment, emitter and base bias voltages are simultaneously applied over a portion of the clock cycle. Accordingly, control current 200 and signal current 300 may flow concurrently versus consecutively. It is to be understood that the properties of the control current 200 and signal current 300 (e.g., timing relative to each other, duration, and magnitude) may be altered to tune the operation of the transistor of an embodiment.

It is important to distinguish the transistor of an embodiment from a filter. For example, a permanent magnetic barrier incorporated into a semiconductor is spin preferential in that it rejects all carriers with spins not aligned with the permanent magnetic field created by the permanent magnet barrier. As such, the filter can at best have unity gain whereas the transistor of an embodiment has a gain greater than one.

Figure 5:
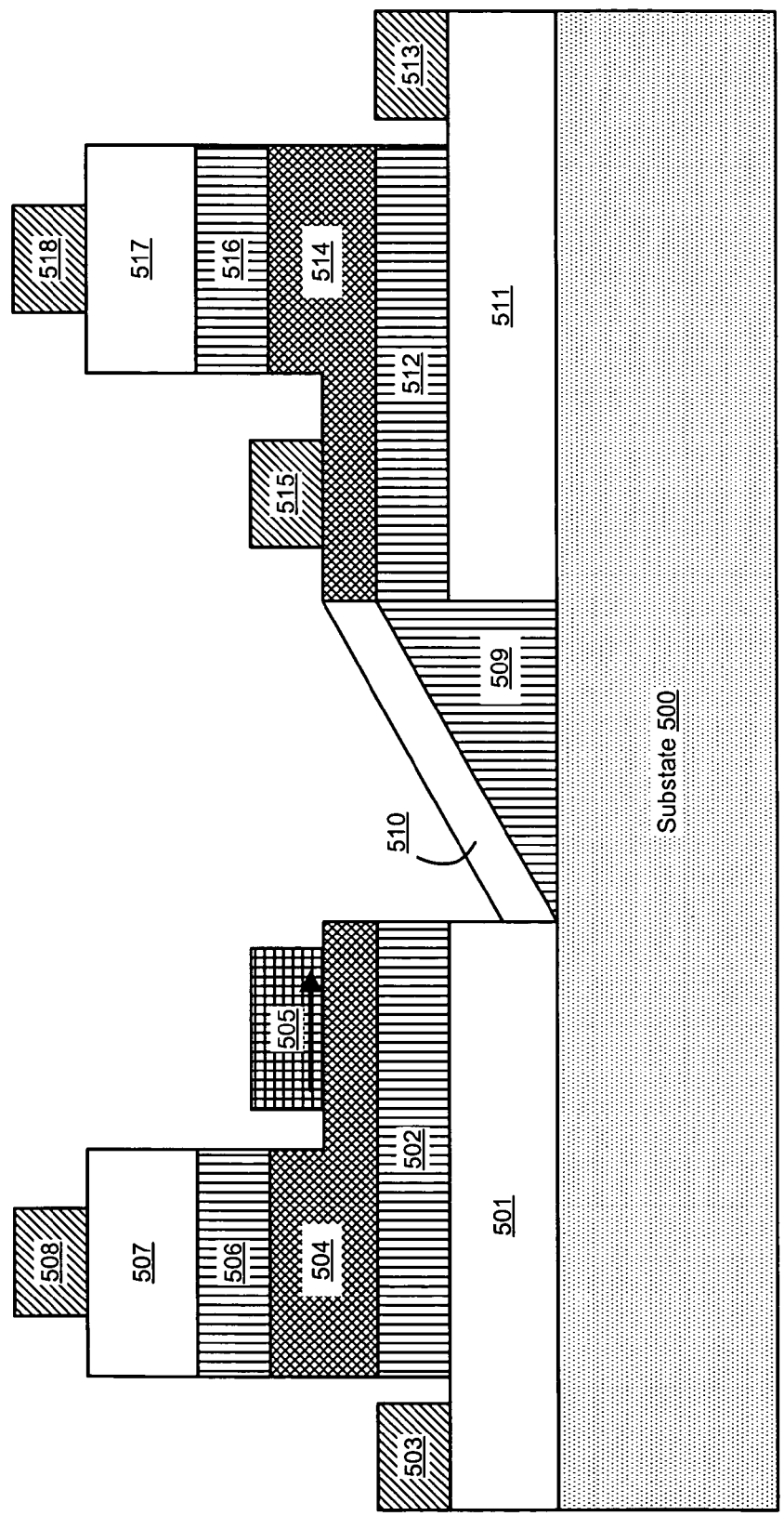
FIG. 5: illustration of a substrate cross section of a device of an embodiment

FIG. 5 illustrates the structure of an embodiment. In an embodiment, the function described above is accomplished with two cascaded (in an embodiment side by side) transistors. Substrate 500 can be any substrate on which it would be useful to fabricate a spin-coherent amplifying device, ranging from, for example, a bulk semiconductor wafer (e.g., silicon, gallium arsenide, germanium, or combinations thereof) to the top interconnect, dielectric, or passivation layer of a dual damascene process architecture including every layer between.

In an embodiment collectors 501 and 511 are non-magnetic p-doped GaAs. In an embodiment, the collectors 501 and 511 are deposited with molecular beam epitaxy (MBE) as is well known in the art. The barrier layers 502 and 512 are similarly MBE deposited and are, in an embodiment, p-doped AlGaAs. As noted above with respect to FIG. 1, the barrier layers 502 and 512 substantially require that the conduction mechanism between collectors 501 and 512 bases 504 and 514 is predominantly tunneling to preserve the spin orientation of the carriers.

In an embodiment, the p-doped AlGaAa of barriers 502 and 512 is $Al_{0.3}Ga_{0.7}As$. The voltage required for a carrier to tunnel through the barriers 502 and 512 with such a composition, and a thickness of an embodiment, is approximately 0.15 eV. Accordingly, the operational voltage of the device of an embodiment exceeds 0.15 V. The upper bound of the operational voltage is limited by, among other reasons, maintaining feasible power dissipation during the operation of the device.

Thereafter, the ferromagnetic p-doped MnGaAs of an embodiment is deposited for bases 504 and 514. In an embodiment, the MnGaAs is deposited with MBE. The manganese of an embodiment both serves as a host of stationary electrons as well as creates holes in the GaAs lattice when the manganese substitutes for the gallium. Further, to substantially prevent formation of MnAs clusters (reducing the frequency of manganese substitution for gallium), the MBE deposition temperature should be approximately between 250° C. and 300° C. Alternatively, atomic layer epitaxy (ALE) may be used to deposit the MnGaAs to substantially prevent arsenic-caused lattice defects that can in turn lead to compensation of n- or p-doping. ALE is a method of depositing thin solid films comprising two or more material types by individual monolayer. Unlike MBE, individual ALE reactants (such as Ga, As, and Mn target evaporant) are alternatingly pulsed (e.g., by a shutter opening and closing) with purges between. An individual reactant binds to the exposed substrate or preceding monolayer strongly until the available chemisorption sites are occupied. Surplus reactant binds weakly and substantially evaporates during the purge. Accordingly, a monolayer growth is substantially self-regulated, and can be further tuned by altering the duration an ALE shutter is open. ALE deposition rates are determined by reflection high-energy electron diffraction (RHEED) measurements on a calibration sample.

As noted, the ferromagnetic properties, in particular the ferromagnetic transition temperature, depend on the composition of the ferromagnetic semiconductor. In an embodiment bases 504 and 514 are $Mn_xGa_{1-x}As$. In an embodiment, x is approximately 0.05. Said alternatively, manganese substitutes for gallium in approximately 5% of the gallium lattice sites. Further, the manganese dopant create free holes (i.e. carriers). For the approximate x=0.05 embodiment, the hole concentration in equilibrium is approximately $4*10^{20}/cm^3$. As process and material alterations may further contribute to the hole concentration, it is to be understood that the hole concentration of an embodiment can range from zero to $1*10^{21}/cm^3$.

Following the deposition of the ferromagnetic p-doped MnGaAs bases 504 and 514, another set of barrier layers 506 and 516 are MBE deposited. In an embodiment, barrier layers 506 and 516 are p-doped AlGaAs. In an embodiment, the p-doped AlGaAa of barriers 506 and 516 is $Al_{0.3}Ga_{0.7}As$. The voltage required for a carrier to tunnel through the barriers 506 and 516 with such a composition, and a thickness of an embodiment, is approximately 0.15 eV. Accordingly, the operational voltage of the device of an embodiment exceeds 0.15V. The upper bound of the operational voltage is limited by, among other reasons, maintaining feasible power dissipation during the operation of the device. Thereafter, non-magnetic p-doped GaAs emitters 507 and 517 are MBE deposited.

Figure 6:
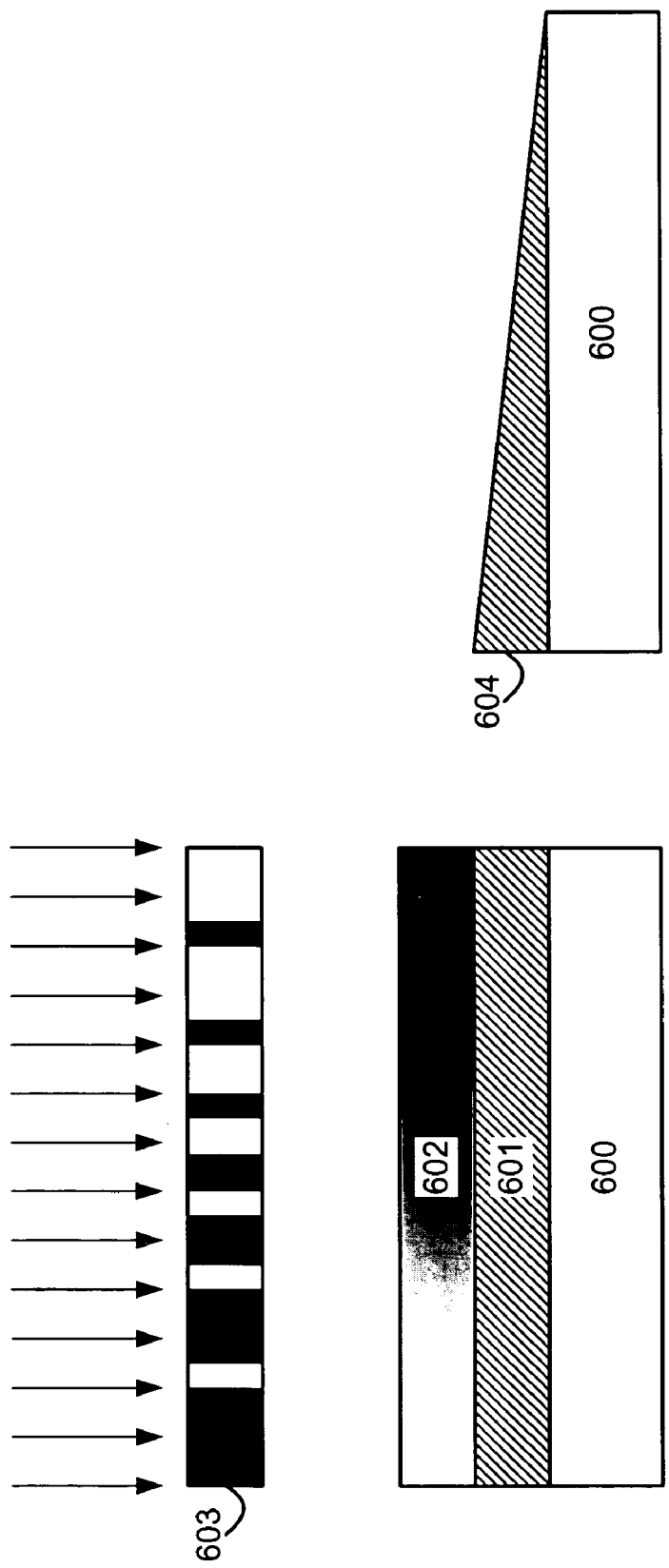
FIG. 6: illustration of a photolithographic mask and process for a graded etch to fabricate a portion of the transistor of an embodiment.

Following the deposition of the non-magnetic, barrier, and magnetic materials, an etch opens the area down to the substrate 500 between the two transistors in preparation of fabricating the semiconductor collector-base interconnect 510 of an embodiment. A tilted plane 509 is thereafter fabricated with a re-growth followed by a graded etch. As illustrated by FIG. 6, a graded etch can be performed by exposing photoresist 602 (atop substrate 600 and semiconductor 601 for illustration) through a photoresist mask 603 containing grating with varying width alternations of transparent and opaque. On exposure, the photoresist mask 603 produces a gradual change in the exposure dose of the photoresist 602. For example, the exposure dose may continuously increase or decrease in a particular direction. The photoresist 602 is thereafter cured and selectively removed, creating a graded thickness of photoresist 602 based on the exposure dose. The graded photoresist in turn facilitates etching the graded profile of the etched semiconductor 604 layer, as areas of etched semiconductor 604 under thicker photoresist 602 will be etched less than areas of etched semiconductor 604 under little or no photoresist 602.

Following the fabrication of the titled plane 509, a non-magnetic layer, in an embodiment MBE deposited p-doped GaAs, can be regrown to connect the collector 501 of the first transistor to the base 514 of the second transistor with a collector-base interconnect 510. The collector-base interconnect 510 (based on underlying tilted plane 509) is graded to connect two layers that are in different hierarchical or topographical layers. For example, as illustrated by FIG. 5, the first transistor collector 501 is more proximal to the substrate than the second transistor base 514. In an embodiment the collector-base interconnect 510 is the same material as the non-magnetic collectors 501, 511, and emitters 507, 517. It is significant that the collector-base interconnect 510 is a semiconductor, as the semiconductor interconnect preserves the spin polarization and coherence of the output current from the first transistor when applied as the signal current to the second transistor. Conversely a metallic or heavily doped polysilicon interconnect, as is common to connect devices occupying the same substrate, would substantially destroy the spin polarization and coherence of the output current of the first transistor that becomes the spin polarized signal current injected into the base 514 of the second transistor.

Another etch defines the emitters 507 and 517. Thereafter, non-ferromagnetic metal is deposited and patterned as is well known in the art to form collector contacts 503, 513, emitter contacts 508, 518, and base contact 515 for the second transistor. A ferromagnetic metal can then be deposited and patterned, as is well known in the art, to form ferromagnetic base contact 505 for the first transistor. In an embodiment, the ferromagnetic metal is iron. In other embodiments the ferromagnetic metal is cobalt or nickel. The substrate including the fabricated transistors is then passivated, in an embodiment with benzocyclobutene (BCB) polymer.

Figure 7:
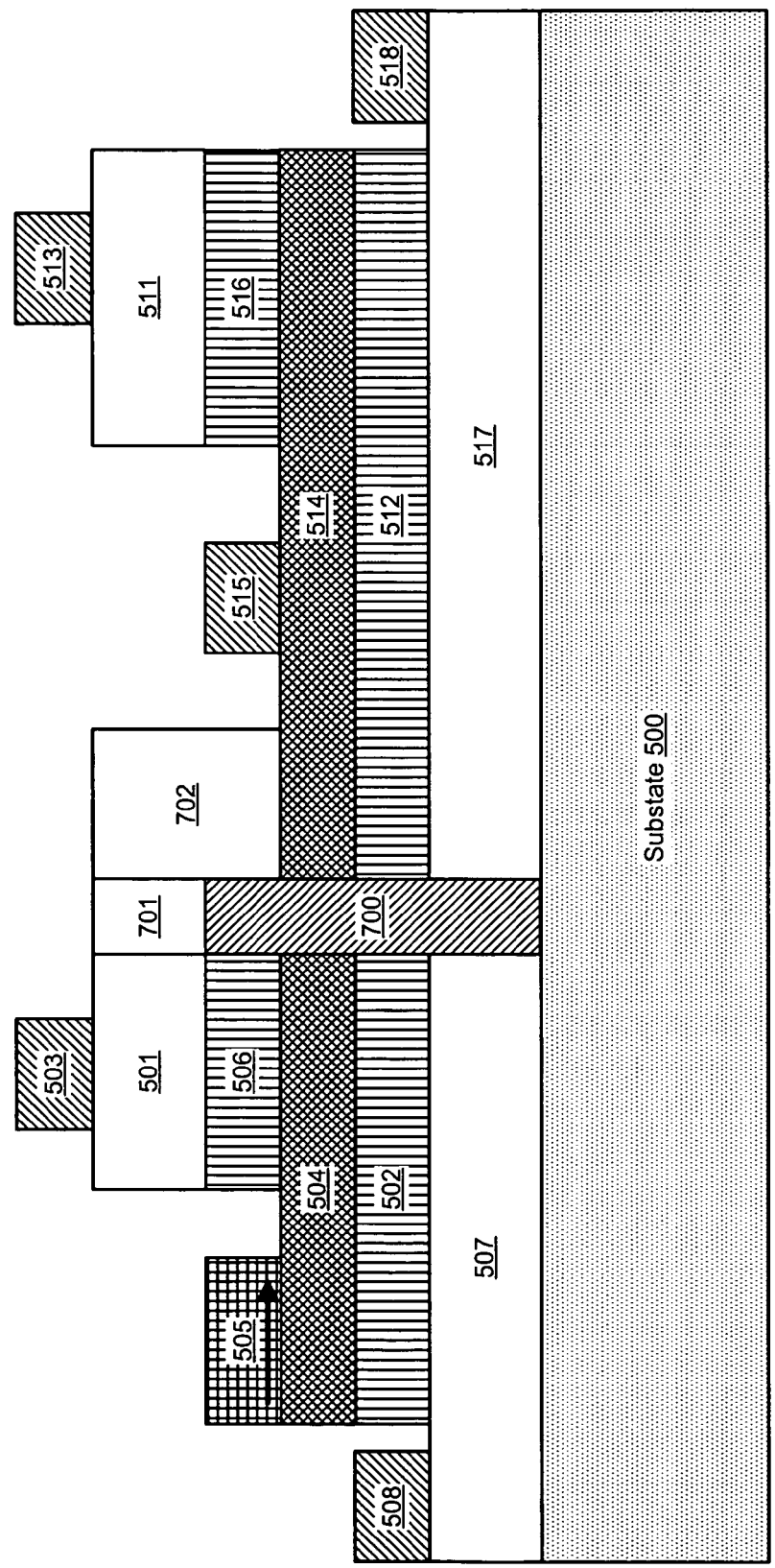
FIG. 7: illustration of a substrate cross section of a device of another embodiment

In an embodiment, the positions of emitters 507, 517 and collectors 501, 511 may be reversed for either the first transistor, the second transistor, or both. In another embodiment, the collector-base interconnect 510 may be horizontal, make a contact to the collector 501 by a terrace 702 as illustrated in FIGS. 7. For example, FIG. 7 illustrates the first transistor with the location (i.e., the proximity to the substrate 500 or hierarchical layer) of the emitter 507 and collector 501 reversed. The contact between the first transistor collector 501 and second transistor base 514 is made by way of a collector-base interconnect 701 deposited atop an isolator 700 and a terrace 702. In an embodiment, the collector-base interconnect 701 and the terrace 702 comprise the same material as collectors 501, 511 and emitters 507, 517. In an embodiment, the collector-base interconnect 701 and terrace 702 are p-doped GaAs. The isolator 700 of an embodiment is a wide band gap semiconductor, though it is understood that other materials may be used to substantially isolate at least a portion of the first transistor from at least a portion of the second transistor.

The fabrication of the embodiment illustrated by FIG. 7 involves the same process and materials listed above with reference to the embodiment illustrated by FIG. 5 for the deposition of the non-magnetic, barrier, and magnetic materials. Following the deposition of the non-magnetic, barrier, and magnetic materials, an etch opens the area between the first and second transistors down to the substrate 500. An isolator 700 is deposited to isolate the collector-base interconnect 701 from the first transistor base 504. In an embodiment, the isolator 700 comprises a wide band gap semiconductor such as undoped AlGaAs. Following the deposition of the isolator 700, an epitaxial re-growth deposits the collector-base interconnect 701. During the fabrication of isolator 700, collector-base interconnect 701 and terrace 702, the collector areas 501, 511 are protected by photoresist.

Another etch defines the collectors 501 and 511. Thereafter, non-ferromagnetic metal is deposited and patterned as is well known in the art to form collector contacts 503, 513, emitter contacts 508, 518, and base contact 515 for the second transistor. A ferromagnetic metal can then be deposited and patterned, as is well known in the art, to form ferromagnetic base contact 505 for the first transistor. In an embodiment, the ferromagnetic metal is iron. In other embodiments the ferromagnetic metal is cobalt or nickel. The substrate including the fabricated transistors is then passivated, in an embodiment with benzocyclobutene (BCB) polymer.

The two transistor combination of embodiments illustrated by FIG. 5 and FIG. 7 operate similarly to the single transistor of an embodiment whose function is illustrated by FIGS. 1–4. In the first transistor, a spin polarized signal current is injected from the ferromagnetic metal base contact 505. The signal current is spin polarized by the ferromagnetic metal base contact 505, as the ferromagnetic metal base contact is spin preferential in that it rejects all carriers with spins not aligned with its permanent magnetic field. The first transistor, operating as illustrated in FIGS. 1–4, then injects a spin-polarized output current from its collector 501 to the ferromagnetic base 514 of the second transistor via the semiconductor collector-base interconnect 510. The second transistor, again operating as illustrated by FIGS. 1–4, generates a coherent spin-polarized output current that has a greater magnitude than the initial signal current incident on the first transistor.

Though described with reference to an embodiment employing a GaAs substrate, GaAs non-magnetic semiconductor, MnGaAs ferromagnetic semiconductor, and AlGaAs barrier, it is to be understood that additional embodiments may employ different combinations of materials. Material combinations of additional embodiments are listed below:

| Ferromagnetic Semiconductor | Barrier | Nonmagnetic Semiconductor | Substrate |
|---|---|---|---|
| MnGaAs | AlGaAs | GaAs | GaAs |
| MnGe | SiGe | Si | Si |
| MnGaN (room temperature) | AlGaN | GaInAsN | GaAs |
| MnCdGeP$_2$ (room temperature) | SiO$_2$ | CdGeP$_2$ | Si |

It is to be further understood that each material type (i.e., ferromagnetic semiconductor, barrier, nonmagnetic semiconductor, and substrate) may further be doped as is well known in the art to alter the material's electrical, chemical, and/or mechanical properties.

It is to be further understood that, while the fabrication process, in particular the deposition, photolithography, and etch, details have been omitted, one skilled in the art will recognize the required steps to fabricate a transistor of an embodiment, or combination thereof as illustrated by FIG. 5. It is further to be understood that while the transistors have been described as first and second for illustrative purposes, there is no intent to limit the orientation of the transistors thereto.

One skilled in the art will recognize the elegance of the disclosed embodiment in that it amplifies the spin polarization a current.

What is claimed is:

1. An apparatus comprising:
   a first spin polarization amplifying transistor, including a ferromagnetic semiconductor base, ferromagnetic metal base contact, non-magnetic semiconductor collector, and non magnetic semiconductor emitter;
   a second spin polarization amplifying transistor, including a ferromagnetic semiconductor base, non-magnetic semiconductor collector, and non magnetic semiconductor emitter: and,
   a semiconductor interconnect coupled to the non-magnetic semiconductor collector of the first spin polarization amplifying transistor and the ferromagnetic semiconductor base of the second spin polarization amplifying transistor.

2. The apparatus of claim 1 further comprising a plurality of barriers between the ferromagnetic semiconductor base and non-magnetic semiconductor collector, and the ferromagnetic semiconductor base and non-magnetic semiconductor emitter, of each spin polarization amplifying transistor.

3. The apparatus of claim 2, the barriers further comprising a material selected from the group consisting of AlGaAs, SiGe, AlGaN, and $SiO_2$.

4. The apparatus of claim 1, the ferromagnetic semiconductor base of each spin polarization amplifying transistor comprising a material selected from the group consisting of MnGaAa, MnGe, MnGaN, and $MnCdGeP_2$.

5. The apparatus of claim 1, the non-magnetic semiconductor collector and non-magnetic semiconductor emitter of each spin polarization amplifying transistor further comprising a material selected from the group consisting of GaAs, Si, GaInAsN, and $CdGeP_2$.

6. The apparatus of claim 1 wherein the semiconductor interconnect is graded to connect the non magnetic semiconductor collector of the first spin polarization amplifying transistor to the ferromagnetic semiconductor base of the second spin polarization amplifying transistor, wherein the ferromagnetic semiconductor base of the second spin polarization amplifying transistor is in a different topological layer than the non magnetic semiconductor collector of the first spin polarization amplifying transistor.

7. The apparatus of claim 1, the semiconductor interconnect further comprising a material selected from the group consisting of GaAs, Si, GaInAsN, and $CdGeP_2$.

8. The apparatus of claim 1 further comprising a terrace coupled to the semiconductor interconnect and the ferromagnetic semiconductor base of the second spin polarization amplifying transistor.

* * * * *